United States Patent [19]

Ruda et al.

[11] Patent Number: 5,745,519
[45] Date of Patent: Apr. 28, 1998

[54] LASER DIODE SYSTEM

[75] Inventors: Mitchell C. Ruda; Tilman W. Stuhlinger; David Pace Caffey, all of Tucson, Ariz.

[73] Assignee: Opto Power Corp., Tucson, Ariz.

[21] Appl. No.: 745,446

[22] Filed: Nov. 12, 1996

[51] Int. Cl.$^6$ .............. H01S 3/08; G02B 3/02; G02B 3/06; G02B 27/10
[52] U.S. Cl. .............. 372/101; 359/719; 359/710; 359/623; 359/628; 385/34
[58] Field of Search .................. 372/108, 109, 372/101; 385/33, 34, 35, 93; 359/719, 710, 623, 628

[56] References Cited

U.S. PATENT DOCUMENTS 5,081,639  1/1992  Snyder et al. ............... 372/101
5,127,068  6/1992  Baer et al. .................. 385/34

Primary Examiner—Rodney B. Bovernick
Assistant Examiner—Luong-Quyen T. Phan
Attorney, Agent, or Firm—Herbert M. Shapiro

[57] ABSTRACT

Laser diode bars with a plurality of light emitting facets have the light from those facets coupled into corresponding fibers of a fiber optic bundle via a microlens having a superconic cross section. An improvement in energy coupling of the typically less than 85 percent to up to 95 percent is achieved.

7 Claims, 2 Drawing Sheets

LASER DIODE SYSTEM

This invention relates to laser diode bars and more particularly to microlenses for collimating or focusing light from the emitting surfaces of the bars for coupling into optical fibers or for other applications.

BACKGROUND OF THE INVENTION

It is well known to couple light from a plurality of emitting surfaces of a laser diode bar into a corresponding plurality of optical fibers. Typically, the coupling is accomplished via the agency of a microlens which is positioned astride the emitting surfaces between the emitting surfaces and the plurality of optical fibers. An arrangement of a laser diode bar coupled to optical fibers via a cylindrical, collimating microlens is disclosed in U.S. Pat. No. 5,127,068 issued Jun. 30, 1992. U.S. Pat. No. 5,080,706 patent discloses a method for making microlenses of any shape. Both of these patents are incorporated herein by reference.

BRIEF DESCRIPTION OF THE INVENTION

The present invention is based on the recognition that a microlens having a superconic cross section produces preferred results when positioned between the emitting surfaces of a laser bar and a plurality of optical fibers coupled to those emitting surfaces. Specifically, a microlens with a superconic cross section produces a coupling efficiency, from the emitting surfaces into the optical fibers, of about 92 to 95 percent as compared to about, at most, an 85 percent efficiency of prior art microlenses with any other cross sectional profile.

DETAILED DESCRIPTION OF AN ILLUSTRATIVE EMBODIMENT OF THIS INVENTION

Figure 1:
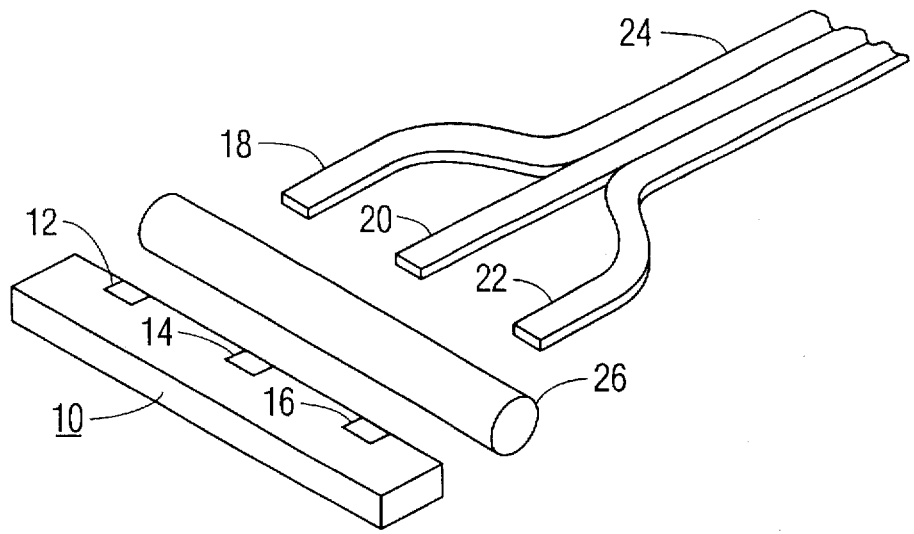
FIG. 1 is a schematic illustration of a prior art arrangement for coupling the outputs from a laser bar with an optical fiber bundle.

FIG. 1 shows a laser bar 10 with, illustratively, three emitting surfaces, or facets, 12, 14, and 16. The facets are coupled to optical fibers 18, 20, and 22, respectively. The optical fibers are gathered together to form a fiber optic bundle 24. The proximal ends of the fibers are positioned to correspond to facets 12, 14, and 16 and are spaced apart from those facets by microlens 26.

The microlens (26) of FIG. 1 is cylindrical, having a circular cross section. But U.S. Pat. No. 5,127,068 suggests that other cross sectional shapes, such as elliptical and hyperbolic, may be used. In accordance with the principles of this invention, the microlens has a superconic cross section. The "superconic" is a standard ZEMAX surface type described by the following equation:

$$s^2/\gamma + v_1 \cdot s^4 - 2 \cdot z(1 + u_1 \cdot s^2) + k \cdot z^2/\gamma = 0$$

where
$s^2 = y^2 + z^2$
y=surface height, z=surface sag
$\gamma$=radius of curvature
k=conic constant
$v_1, u_1$=superconic coefficient
Values for this design are given in the following table:

| Plano-elliptical fiber specifications (wavelength = 0.87 um) | | | |
|---|---|---|---|
| | | Plano-superconic fiber | Conic-superconic fiber |
| Working distance (mm) | | 0.0088 | 0.036342 |
| Numerical aperture | | 0.96 | 0.91 |
| Surface number | Parameter | | |
| 1 | Radius of curvature (mm) | infinite | −0.3251 |
| | Conic constant | 0.0 | −7.53759 |
| | Sag at aperture semi-diameter (mm) | 0.0 | −0.01354 |
| | Aperture semi-diameter (mm) | 0.0975 | 0.1 |
| | Thickness (mm) | 0.19 | 0.36096 |
| 2 | Radius of curvature (mm) | −0.09 | −0.18291 |
| | Conic constant | −0.49388 | −0.37243 |
| | u1 | −26.61304 | −1.65680 |
| | v1 | 231.31102 | 7.98815 |
| | Sag at aperture semi-diameter (mm) | −0.10950 | −0.19691 |
| | Aperture semi-diameter (mm) | 0.119 | 0.22 |

The superconic lens is used for focusing light emitted by a laser diode. "Focusing" is meant herein to cover the range of effects of a lens on a diverging beam, from decreasing the divergence to collimation to convergence to a spot. Generally, the emitting aperture of a laser diode is rectangular in shape with the long dimension having a size of typically hundreds of microns, while the short dimension is typically one micron in size. Diffraction effects cause the emerging radiation to diverge, with the divergence angle being inversely proportional to the size of the aperture. The short dimension of the aperture is comparable to the typical laser diode wavelength of approximately eight hundred nanometers; diffraction effects result in large beam divergence in this direction. The direction parallel to the short dimension of the aperture, often called the fast axis (or center), may be as high as seventy five degrees. Typically, the sign of this angle, known as the numerical aperture (NA) is used to specify the divergence of the laser radiation in the fast axis.

In most applications, the divergence of the fast axis must be reduced so that the radiation becomes useful for subsequent optical components. In the application of concern here, the radiation must be focused at some distance from the laser diode. The beam diameter must remain small (perhaps several hundred microns in size). The focusing small diameter conditions may be achieved by means of a lens placed at a small distance (the working distance) from the emitting aperture. The working distance and the beam divergence together define the beam diameter at the lens. Since only the fast axis must be focused, the lens typically has optical power only in this axis.

This focusing lens must have a surface figure (or shape) which is in accord with the principles of optical design. These principles require the removal of optical aberrations so that the rays from a point on the emitting aperture are focused by the lens to a point, or are collimated such that all the rays are parallel to each other in the fast axis. This condition is achieved when the spherical aberration is corrected. With cylindrical fiber lenses, the largest NA at which the spherical aberration does not exceed the diffraction limit is about 0.5 (the maximum NA varies with the index of diffraction).

In many applications, a non zero working distance is desired in order to avoid overheating of the lens due to close contact with the laser diode and to simplify alignment. At these working distances rays at large NA's do not intersect the cylindrical surface and radiant energy is lost. Another possible lens shape is a plane on the surface facing the laser diode and conic (typically elliptical) on the opposite surface.

Figure 2:
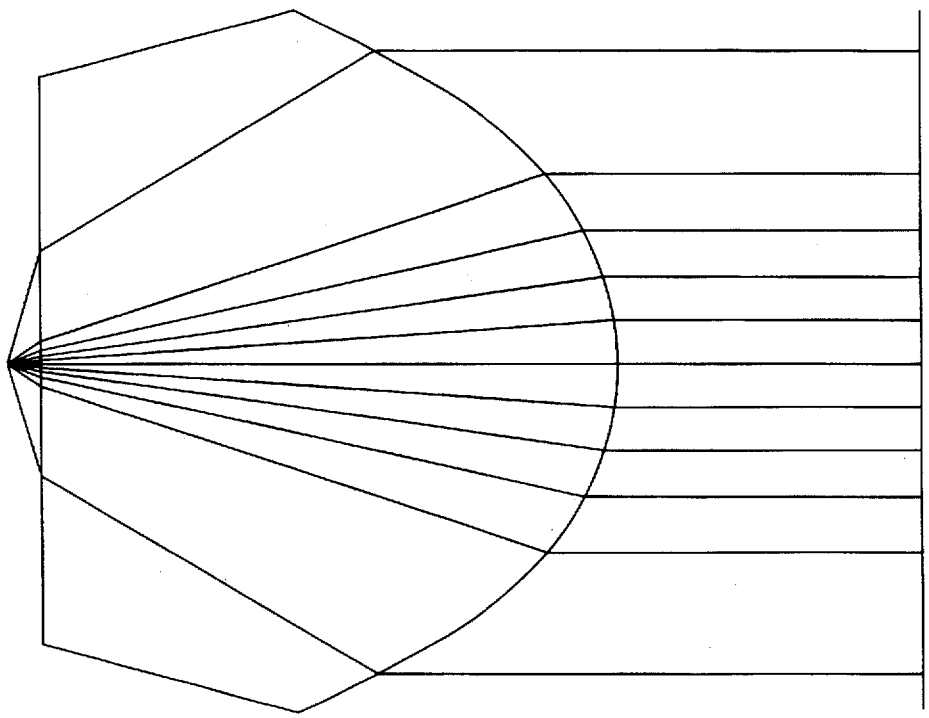
FIG. 2 is a cross section of a microlens having a planoconic cross section.
Figure 3:
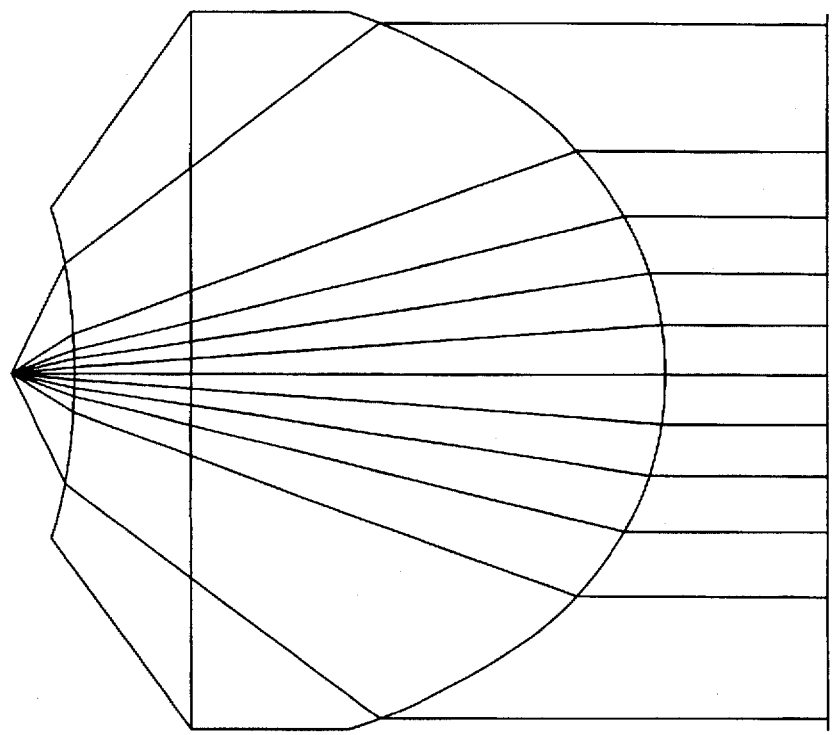
FIGS. 3, and 4 are cross section views of microlenses, having superconic profiles in accordance with the principles of this invention, useful as a coupling for laser energy from a laser bar into a fiber optic bundle analogous to the arrangement shown in FIG. 1.
Figure 4:
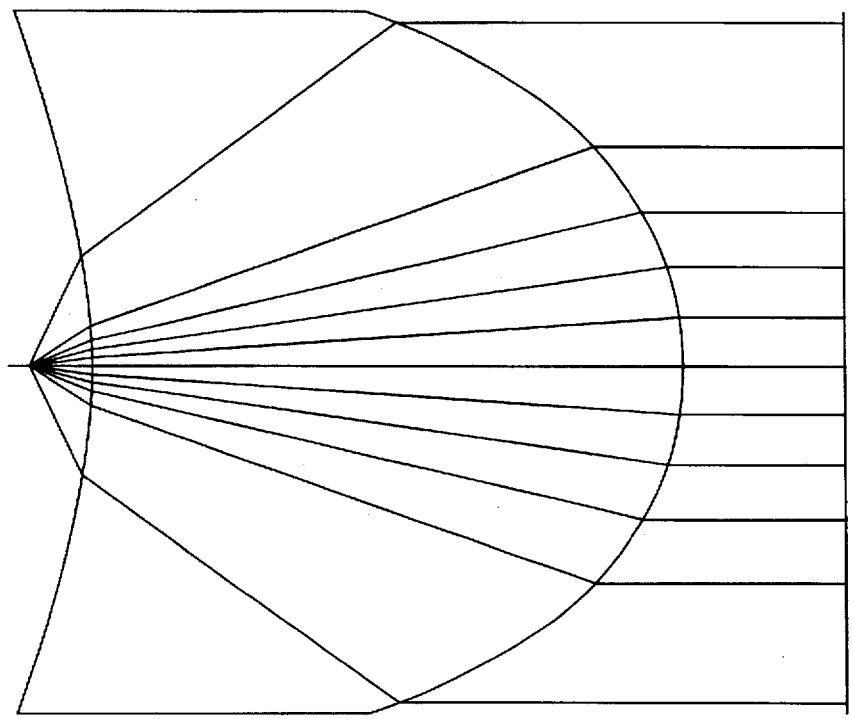

At zero working distance, the correction is adequate with the plano-conic fiber, shown in FIG. 2, even at large NA's. With the non-zero working distance, the plano-conic fiber is adequate only for smaller NA's, typically 0.7 at 0.01 mm working distance. For large working distances combined with large NA's (up to 0.96), general aspheric departures are conventionally used to improve the image quality. However, general aspherics are not adequate to correct spherical aberration at large NA's up to 0.95. In accordance with the present invention, the elliptical surface shape is used to correct the small NA portions of the beam, while a new shape is added which permits correction of spherical aberration within the diffraction limit, with a non-zero working distance with an NA up to 0.96. The new surface shape is known as the superconic. As the working distance increases beyond 0.01 mm for NA's above 0.9, the plano-superconic lens still delivers diffraction-limited performance, but balancing between large amounts of higher-order spherical aberration produces a wavefront with higher order "ripple" which causes spreading of energy from the central core to the wings of the diffraction image. In this case, a concave surface, as shown in FIGS. 3 and 4, facing the laser diode is useful for reducing the higher orders of spherical abberation and thus providing an optimal diffraction spot.

Depending on the working distance and on the NA, this concave surface may be either spherical, conic or superconic. An embodiment employing a conic surface is given in the table above Thus, the concave-superconic fiber lens delivers optimal performance at large working distances and large NA's.

A large working distance is useful for the following reasons: The working distance may be adjusted to account for fabrication-induced errors in the fiber-lens focal length; laser diodes are frequently surrounded by peripheral equipment such as heat sinks which may protrude beyond the emitting face of the diode in the direction of the fiber-lens. The large working distance keeps the fiber-lens clear of such protrusions; the irradiance of the fiber-lens is reduced at larger working distances and heat-related problems in the fiber-lens are thus reduced.

In a conventional general aspheric surface type, terms proportional to various even powers of the ray height "y" (perpendicular to the optic axis) are added to the basic conic surface description in order to effect correction of spherical aberration. For the case of the superconic type, the ray height y is replaced by the distance "s" from the vertex of the surface to the point of intersection of a ray on the surface. Thus, the surface correction terms are applied to the ray intersection point rather than to the plane tangent to the surface at the vertex (as is the case in general aspherics). At the steep ray angles encountered with rays at large NAs, a vertical displacement between the intersection point and the y height occurs. This renders the general aspheric increasingly (with increasing NA) inadequate in correcting the aberration. With the superconic type, the aspheric correction terms are compressed in the y direction so that the correction is applied in the proper location.

What is claimed is:

1. A diode laser system comprising a laser bar having a plurality of emitting facets, said system including a microlens aligned astride said facets and being operative to collimate light from each of said facets, said microlens having a superconic cross section with a non planar surface facing said emitting facet.

2. A system as in claim 1 also including a fiber optic bundle, said bundle including a plurality of optical fibers, each fiber of said bundle having an end energy coupled to said microlens in a position corresponding to an associated one of said facets.

3. A system as in claim 2 wherein said micrlens has a cross section defined by the equation $$s^2/\gamma + v_1 \cdot s^4 - 2 \cdot z(1 + u_1 \cdot s^2) + k \cdot z^2/\gamma = 0$$

where $s^2 = y^2 + z^2$ y=surface height, z=surface sag $\gamma$=radius of curvature k=conic constant $v_1, u_1$=superconic coefficient.

4. A system as in claim 2 wherein said microlens is spaced apart from said emitting facets a distance of at least 0.01 mm.

5. A system as in claim 1 wherein said microlens is spaced apart from said emitting facets.

6. A system as in claim 5 wherein said microlens is spaced apart from said emitting facets a distance of at least 0.01 mm.

7. An optical fiber for coupling light from each of a plurality of light emitting facets of a laser diode bar into associated fibers of a fiber optic bundle, said fiber having a superconic cross section with first and second non planar surfaces for alignment with said facets and said fibers respectively.

* * * * *